United States Patent [19]
Rinne et al.

[11] Patent Number: 5,892,179
[45] Date of Patent: Apr. 6, 1999

[54] SOLDER BUMPS AND STRUCTURES FOR INTEGRATED REDISTRIBUTION ROUTING CONDUCTORS

[75] Inventors: Glenn A. Rinne; Joseph Daniel Mis, both of Cary, N.C.

[73] Assignee: MCNC, Research Triangle Park, N.C.

[21] Appl. No.: 977,258

[22] Filed: Nov. 24, 1997

Related U.S. Application Data

[63] Continuation of Ser. No. 416,619, Apr. 5, 1995, abandoned.

[51] Int. Cl.⁶ .................................................. H01R 9/09
[52] U.S. Cl. ........................................ 174/261; 361/767
[58] Field of Search .................... 174/261, 260, 174/259, 267; 361/767, 777, 779, 774, 768, 760; 228/254; 257/737, 738, 778, 779, 780

[56] References Cited

U.S. PATENT DOCUMENTS

| | | | |
|---|---|---|---|
| 3,501,681 | 3/1970 | Weir | 317/234 |
| 3,663,184 | 5/1972 | Wood et al. | 29/195 |
| 3,760,238 | 9/1973 | Hamer et al. | 317/234 R |
| 3,770,874 | 11/1973 | Krieger et al. | 174/260 X |
| 3,871,014 | 3/1975 | King et al. | 357/67 |
| 3,871,015 | 3/1975 | Lin et al. | 357/67 |
| 3,942,187 | 3/1976 | Gelsing et al. | 357/71 |
| 4,113,578 | 9/1978 | Del Monte | 204/15 |

(List continued on next page.)

FOREIGN PATENT DOCUMENTS

| | | |
|---|---|---|
| 2 406 893 | 10/1978 | France . |
| 55-111127 | 8/1980 | Japan . |
| 57-73952 | 5/1982 | Japan . |
| 57-197838 | 12/1982 | Japan . |
| 59-154041 | 9/1984 | Japan . |
| 61-16552 | 1/1986 | Japan . |
| 63-222445 | 9/1988 | Japan . |
| 4-150033 | 5/1992 | Japan . |
| 1 288 564 | 9/1972 | United Kingdom . |

WO 93/22475 11/1993 WIPO .

OTHER PUBLICATIONS

Stanley, Hirsch, "Tin–Lead, Lead and Tin Plating," *Metal Finishing Guidebook Directory 1987*, Mid Jan. 1987, vol. 85, No. 1 A.

Adema et al., *Flip Chip Technology: A Method for Providing Known Good Die with High Density Interconnections*, MCM '94 Proceedings, pp.41–49.

Datta et al., *Electrochemical Fabrication of Mechanically Robust PbSn C4 Interconnections*, J. Electrochem. Soc., vol. 142, No. 11, The Electrochemical Society, Inc., Nov. 1995, pp. 3779–3785.

Hirsch,*Tin–Lead, Lead And Tin Plating*, Metal Finishing, Guidebook Directory 1987, 55th Guidebook–Directory Issue 1987, Mid Jan. 1987, vol. 85, No. 1A, ISSN 0026–0576, pp. 280–284.

Inaba et al., *Solder Bump Formation Using Electroless Plating and Ultrasonic Soldering*, IEEE Transactions On Components, Hybrids, And Manufacturing Technology, vol. 13, No. 1, Mar. 1990, pp. 119–123.

*Primary Examiner*—Kristine Kincaid
*Assistant Examiner*—William Silverio
*Attorney, Agent, or Firm*—Alston & Bird LLP

[57] ABSTRACT

A solder bump structure on a microelectronic substrate including an electrical contact having an exposed portion. This solder bump structure includes an under bump metallurgy structure on the microelectronic substrate, and a solder structure on the under bump metallurgy structure opposite the microelectronic substrate. The metallurgy structure includes an elongate portion having a first end which electronically contacts the exposed portion of the electrical contact and an enlarged width portion connected to a second end of the elongate portion. The solder structure includes an elongate portion on the metallurgy structure and an enlarged width portion on the enlarged width portion of the metallurgy structure. Accordingly, the enlarged width portion of the solder structure can be formed on a portion of the microelectronic substrate other than the contact pad and still be electronically connected to the pad.

20 Claims, 4 Drawing Sheets

U.S. PATENT DOCUMENTS

| | | | |
|---|---|---|---|
| 4,545,610 | 10/1985 | Lakritz et al. | 29/589 |
| 4,878,611 | 11/1989 | LoVasco et al. | 228/180.2 |
| 4,948,754 | 8/1990 | Kondo et al. | 437/183 |
| 4,950,623 | 8/1990 | Dishon | 437/183 |
| 4,962,058 | 10/1990 | Cronin et al. | 437/187 |
| 5,160,409 | 11/1992 | Moore et al. | 156/656 |
| 5,162,257 | 11/1992 | Yung | 437/183 |
| 5,194,137 | 3/1993 | Moore et al. | 205/125 |
| 5,250,843 | 10/1993 | Eichelberger | 257/692 |
| 5,293,006 | 3/1994 | Yung | 174/261 |
| 5,327,013 | 7/1994 | Moore et al. | 257/772 |
| 5,354,711 | 10/1994 | Heitzmann et al. | 437/182 |
| 5,453,582 | 9/1995 | Amano et al. | 174/261 |
| 5,547,740 | 8/1996 | Higdon et al. | 428/209 |

SOLDER BUMPS AND STRUCTURES FOR INTEGRATED REDISTRIBUTION ROUTING CONDUCTORS

This application is a continuation of application Ser. No. 08/416,619, filed Apr. 5, 1995, abandoned.

FIELD OF THE INVENTION

This invention relates to the field of microelectronic devices and more particularly to solder bumps for microelectronic devices.

BACKGROUND OF THE INVENTION

High performance microelectronic devices often use solder balls or solder bumps for electrical and mechanical interconnection to other microelectronic devices. For example, a very large scale integration (VLSI) chip may be electrically connected to a circuit board or other next level packaging substrate using solder balls or solder bumps. This connection technology is also referred to as "Controlled Collapse Chip Connection—C4" or "flip-chip" technology, and will be referred to herein as "solder bumps".

A significant advance in this technology is disclosed in U.S. Pat. No. 5,162,257 to Yung entitled "Solder Bump Fabrication Method" and assigned to the assignee of the present invention. In this patent, an under bump metallurgy is formed on the microelectronic substrate including contact pads, and solder bumps are formed on the under bump metallurgy opposite the contact pads. The under bump metallurgy between the solder bumps and the contact pads is converted to an intermetallic which is resistant to etchants used to etch the under bump metallurgy between solder bumps. Accordingly, the base of the solder bumps is preserved.

In many circumstances, it may be desired to provide a solder bump on the substrate at a location remote from the contact pad and also form an electrical connection between the contact pad and the solder bump. For example, a microelectronic substrate may be initially designed for wire bonding with the contact pads arranged around the outer edge of the substrate. At a later time it may be desired to use the microelectronic substrate in an application requiring solder bumps to be placed in the interior of the substrate. In order to achieve the placement of a solder bump on the interior of the substrate away from the respective contact pad, an interconnection or redistribution routing conductor may be necessary.

U.S. Pat. No. 5,327,013 to Moore et al. entitled "Solder Bumping of Integrated Circuit Die" discloses a method for forming a redistribution routing conductor and solder bump on an integrated circuit die. This method includes forming a terminal of an electrically conductive, solder-wettable composite material. The terminal includes a bond pad overlying the passivation layer remote from a metal contact and a runner that extends from the pad to the metal contact. A body of solder is reflowed onto the bond pad to form a bump bonded to the pad and electrically coupled through the runner.

In this method, however, the solder bump is formed by pressing a microsphere of a solder alloy onto the bond pad. In addition, the spread of solder along the runner during reflow is limited. In the illustrated embodiment, a solder stop formed of a polymeric solder resist material is applied to the runner to confine the solder to the bond pad.

Notwithstanding the above mentioned references, there continues to exist a need in the art for methods of producing redistribution routing conductors and solder bumps efficiently and at a reduced cost.

SUMMARY OF THE INVENTION

It is therefore an object of the present invention to provide an improved method of forming a redistribution routing conductor.

It is another object of the present invention to provide a method of forming a redistribution routing conductor which can be integrally formed together with an associated solder bump.

These and other objects are provided, according to the present invention, by forming an under bump metallurgy layer on the microelectronic substrate and forming a solder structure including an elongate portion and an enlarged width portion on the under bump metallurgy layer. The solder structure can be formed by electroplating on the desired portions of the under bump metallurgy layer which are defined by a mask. The excess portions of under bump metallurgy not covered by solder can then be selectively removed using the solder structure as a mask. Accordingly, a single masking step can be used to define both the solder structure and the under bump metallurgy layer.

The solder can then be made to flow. Unexpectedly, the surface tension within the solder will cause the flowing solder to form a thin solder layer on the elongate portion of the under bump metallurgy layer and a raised solder bump on the enlarged width portion of the under bump metallurgy layer. Accordingly, a single solder deposition step followed by a solder flow step (typically induced by heat) can be used to form a solder structure including both a thin elongate portion and a raised enlarged width portion.

In one embodiment, the present invention includes a method of forming a redistribution routing conductor on a microelectronic substrate including an electrical contact pad at a surface of the microelectronic substrate. This method includes the steps of forming an under bump metallurgy layer on the surface, and forming a solder structure on the under bump metallurgy layer opposite the microelectronic substrate. The under bump metallurgy layer electrically contacts the electrical contact pad, and the solder structure includes an elongate portion and an enlarged width portion.

The step of forming a solder structure preferably includes the step of forming a solder structure including an elongate portion which extends over the electrical contact pad. This solder structure may define first (exposed) and second (unexposed) portions of the under bump metallurgy layer, and the step of forming a solder structure may be followed by the step of selectively removing the first (exposed) portion of the under bump metallurgy layer which is not covered by the solder structure. Accordingly, the solder structure can be used as a masking layer to selectively remove the first portion of the under bump metallurgy layer not covered by solder after forming the solder structure, thereby eliminating the need for separate photolithography steps to pattern the solder structure and the under bump metallurgy layer.

The elongate solder portion preferably has one end that is positioned on the under bump metallurgy layer opposite the contact pad and a second end that is connected to the enlarged width portion. Accordingly, the solder structure defines respective elongate and enlarged width portions of the under bump metallurgy layers, and one end of the elongate portion of the under bump metallurgy layer preferably makes electrical contact with the contact pad. It will be understood that other elongate solder portions may extend across the under bump metallurgy layer in other directions from the point opposite the contact pad, and also that the elongate portion may extend slightly beyond the point opposite the contact pad.

This method may also include the step of causing the solder in the solder structure to flow from the elongate portion to the enlarged width portion. Accordingly, a raised solder bump may be formed in the enlarged width portion of the solder structure and a thin solder layer may be formed in the elongate portion of the solder structure. This step is preferably accomplished by heating the solder above its liquidus temperature and confining it to the elongate and enlarged width portions of the under bump metallurgy layer so that surface tension induced internal pressures cause the solder to flow to the enlarged width portions. The flowing solder may be confined by forming a solder dam layer on the first (exposed) portion of the under bump metallurgy layer which is not covered by the solder structure.

The step of causing the solder structure to flow may form an intermetallic region between the under bump metallurgy layer and the solder structure. This intermetallic region includes a constituent of the metallurgy layer and a constituent of the solder structure. This intermetallic region is resistant to etchants used to remove the first (exposed) portion of the under bump metallurgy layer thereby reducing undercutting of the solder structure.

The step of forming the under bump metallurgy layer preferably includes the steps of forming a chromium layer on the microelectronic substrate, forming a phased layer of chromium and copper on the chromium layer, and forming a copper layer on the phased layer opposite the chromium layer. This structure provides an electrically conductive base that will adhere to the microelectronic substrate and contact pad as well as the solder structure. The step of forming the under bump metallurgy layer may also include the step of forming a titanium layer between the microelectronic substrate and the chromium layer.

The step of forming the solder structure may include the steps of forming a patterned mask layer on the under bump metallurgy layer, forming the solder structure on the second portion of the under bump metallurgy layer, and selectively removing the patterned mask layer. The patterned mask layer preferably covers the first portion of the under bump metallurgy layer and defines the second portion of the under bump metallurgy layer on which the solder structure is formed.

In addition, the step of forming the solder structure includes the step of electroplating solder on the second portion of the under bump metallurgy layer. By forming an under bump metallurgy layer that extends across the microelectronic substrate, the under bump metallurgy layer can be used as an electroplating electrode for a plurality of solder structures. Accordingly, a plurality of solder structures can be formed in a single electroplating step with each solder structure having a common uniform height.

The present invention also includes a solder bump structure on a microelectronic substrate including an electrical contact having an exposed portion. This solder bump structure includes an under bump metallurgy structure on the microelectronic substrate, and a solder structure on the under bump metallurgy structure opposite the microelectronic substrate. The metallurgy structure includes an elongate portion having a first end which electrically contacts the exposed portion of the electrical contact and an enlarged width portion connected to a second end of the elongate portion. The solder structure includes an elongate portion on the metallurgy structure and an enlarged width portion on the enlarged width portion of the metallurgy structure. Accordingly, the enlarged width portion of the solder structure can be formed on a portion of the microelectronic substrate other than the contact pad and still be electrically connected to the pad.

The elongate portion of the solder structure may have a first predetermined thickness and the enlarged width portion of the solder structure may have a second predetermined thickness. The first predetermined thickness is preferably thin relative to the second predetermined thickness. Accordingly, the enlarged width portion of the solder structure preferably forms a raised solder bump which can be used to connect the microelectronic substrate, both electrically and mechanically, to a printed circuit board or other next level packaging substrate. Alternately, the elongate portion of the solder structure and the enlarged width portion of the solder structure may have a common predetermined thickness.

The solder bump structure may also include an intermetallic region between the under bump metallurgy structure and the solder structure, and this intermetallic region includes a constituent of the metallurgy structure and a constituent of the solder structure.

Alternately, a solder bump structure may include an under bump metallurgy layer on the microelectronic substrate and electrically contacting the exposed portion of the electrical contact. This solder bump structure also includes a solder structure on the under bump metallurgy layer opposite the microelectronic substrate. The solder structure includes an elongate portion having a first end opposite the exposed portion of the electrical contact and an enlarged width portion connected to a second end of the elongate portion. This under bump metallurgy layer may extend across the microelectronic substrate with the solder structure defining first (exposed) and second (unexposed) portions of the under bump metallurgy layer. This continuous under bump metallurgy layer may be used as an electrode for electroplating.

In addition, the structure may include a solder dam on the first (exposed) portions of the under bump metallurgy layer. This solder dam may be used to contain the solder during a solder flow step as discussed above.

Accordingly, an under bump metallurgy layer can be formed on a microelectronic substrate and used as an electrode to electroplate a solder structure including an elongate portion and an enlarged width portion. The solder structure is then used as a mask to selectively remove the portions of the under bump metallurgy layer not covered by the solder structure. A single photolithography step can therefore be used to pattern both the solder structure and the under bump metallurgy layer. In addition, the solder can be caused to flow from the elongate portion of the solder structure to the enlarged width portion thereby forming a raised solder bump. This is preferably achieved by heating the solder above its liquidus temperature allowing surface tension induced internal pressures to affect the flow. Accordingly, a stable multi-level solder structure is produced.

DETAILED DESCRIPTION OF PREFERRED EMBODIMENTS

Figure 1:
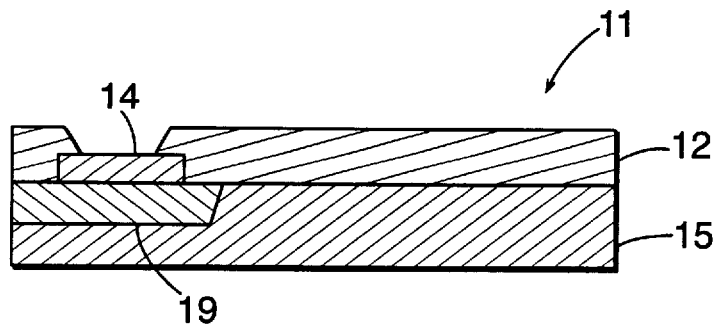
FIGS. 1–5 are cross sectional side views of a microelectronic substrate at various stages during the manufacture of a redistribution routing conductor according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 5:
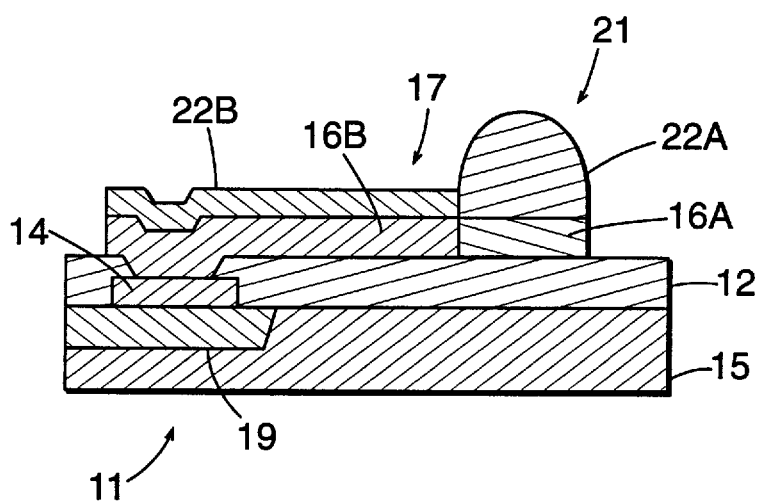
Figure 10:
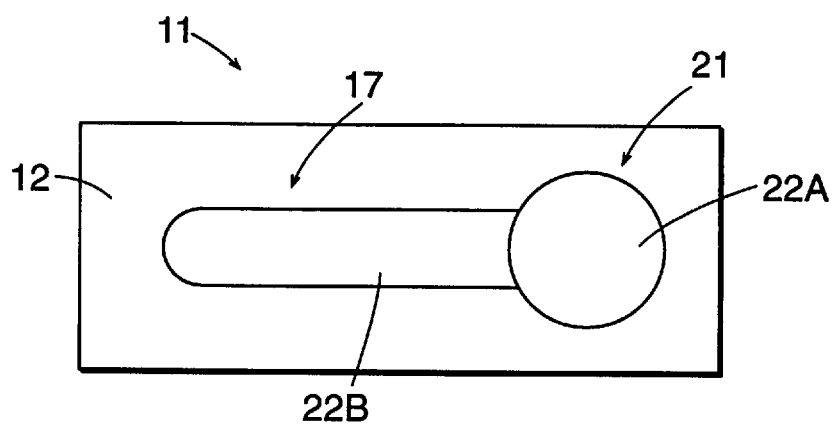

The invention relates to a microelectronic structure 11 including a redistribution routing conductor and a raised solder bump, as shown from the side in FIG. 5 and as shown from the top in corresponding FIG. 10. The microelectronic structure includes a contact pad 14 and passivation layer 12 on a substrate 15. The redistribution routing conductor 17 and solder bump 21 each include respective portions of under bump metallurgy layer 16A–B and solder layer 22A–B.

The redistribution routing conductor 17 includes a relatively elongate solder portion 22B on a respective elongate under bump metallurgy portion 16B. The solder bump 21 includes an enlarged width solder portion 22A on a respective enlarged width under bump metallurgy portion 16A. Preferably the elongate solder portion 22B is relatively thin while the enlarged width solder portion 22A is raised, as shown in FIG. 5.

Accordingly, the solder bump 21 can be located at a point on the substrate relatively distant from the contact pad 14 with the redistribution routing conductor 17 providing an electrical connection therebetween. This arrangement provides the advantage that a substrate having a layout with a contact pad 14 at one predetermined location can have an associated solder bump at a second location. This can be particularly useful, for example, when a substrate has a layout with contact pads arranged for wire bonding, and it is desired to use the substrate in a flip-chip application. This solder bump and redistribution routing conductor can be fabricated simultaneously, as described below with regard to FIGS. 1–10.

While the redistribution routing conductor 17 can be straight as shown, it may also include bends and curves. Furthermore, the solder bump 21 may be circular as shown or it can have other shapes such as rectangular.

Figure 6:
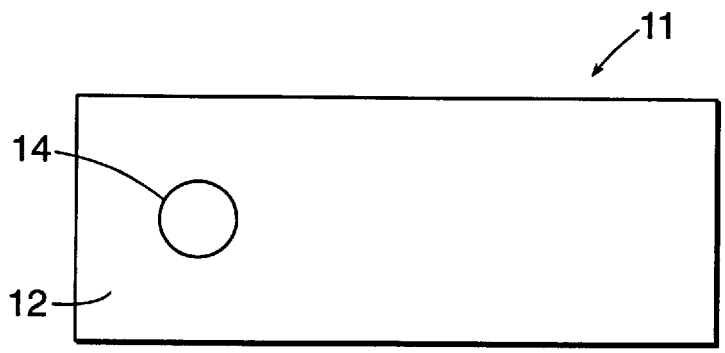
FIGS. 6–10 are top views of a microelectronic substrate at various stages during the manufacture of a redistribution routing conductor corresponding respectively to FIGS. 1–5.

The solder bump 21 and the redistribution routing conductor 17 are preferably formed simultaneously. FIGS. 1–5 are cross-sectional side views of microelectronic structures at various stages of fabrication, while FIGS. 6–10 are corresponding top views of the same microelectronic structures. The microelectronic structure 11 initially includes a passivation layer 12 and an exposed contact pad 14 on a substrate 15, as shown in FIGS. 1 and 6.

The substrate 15 can include a layer of a semiconducting material such as silicon, gallium arsenide, silicon carbide, diamond, or other substrate materials known to those having skill in the art. This layer of semiconducting material can in turn include one or more electronic devices such as transistors, resistors, capacitors, and/or inductors. The contact pad 14 may comprise aluminum, copper, titanium, an intermetallic including combinations of the aforementioned metals such as AlCu and $AlTi_3$, or other materials known to those having skill in the art. This contact is preferably connected to an electronic device in the substrate.

The passivation layer 12 can include polyimide, silicon dioxide, silicon nitride, or other passivation materials known to those having skill in the art. As shown, the passivation layer 12 may cover top edge portions of the contact pad 14 opposite the substrate 15, leaving the central portion of the contact pad 14 exposed. As will be understood by those having skill in the art, the term substrate may be defined so as to include the passivation layer 12 and contact pad 14 of FIGS. 1 and 6.

Figure 2:
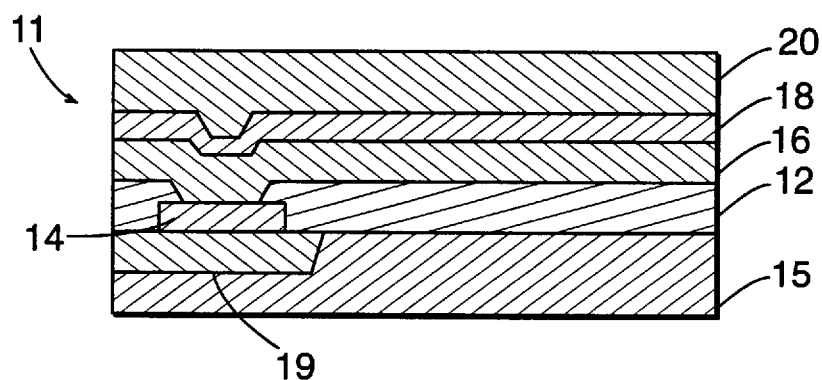
Figure 7:
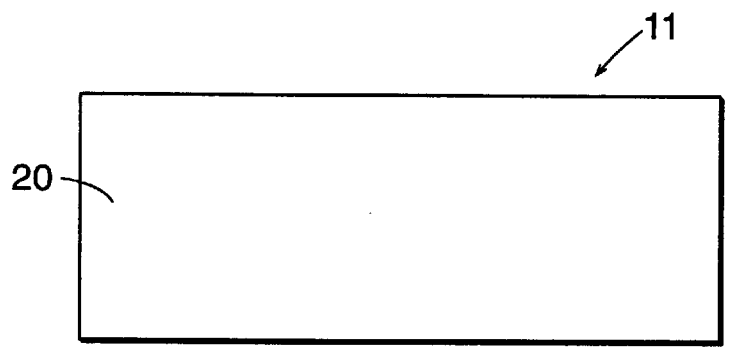

An under bump metallurgy layer 16 is formed on the passivation layer to provide a connection between the solder bump and the contact pad 14 and to provide a plating electrode, as shown in FIGS. 2 and 7. The under bump metallurgy layer 16 also protects the contact pad 14 and passivation layer 12 during subsequent processing steps, and provides a surface to which the solder will adhere. The under bump metallurgy layer preferably includes a chromium layer on the passivation layer 12 and contact pad 14; a phased chromium/copper layer on the chromium layer; and a copper layer on the phased layer. This structure adheres to and protects the passivation layer 12 and contact pad 14, and also provides a base for the plated solder which follows.

The under bump metallurgy layer may also include a titanium barrier layer between the substrate and the chromium layer as disclosed in U.S. Patent Application entitled "Solder Bump Fabrication Methods and Structures Including a Titanium Barrier Layer" filed Mar. 20, 1995 and assigned to the assignee of the present invention. This titanium barrier layer protects the passivation layer from etchants used to remove the other components of the under bump metallurgy layer and also prevents the formation of residues on the passivation layer which may lead to shorts between solder bumps and redistribution routing conductors. The titanium layer can be easily removed from the passivation layer without leaving significant residues.

Various under bump metallurgy layers are disclosed, for example, in U.S. Pat. No. 4,950,623 to Dishon entitled "Method of Building Solder Bumps", U.S. Pat. No. 5,162,257 to Yung entitled "Solder Bump Fabrication Method", and U.S. Patent Application to Mis et al. entitled "Solder Bump Fabrication Methods and Structures Including a Titanium Barrier Layer" filed on Mar. 20, 1995. Each of these references is assigned to the assignee of the present invention, and the disclosure of each is hereby incorporated in its entirety herein by reference.

A solder dam 18 can be formed on the under bump metallurgy layer 16. This solder dam 18 preferably includes a layer of a solder non-wettable material such as titanium or chromium on the under bump metallurgy layer 16. The solder dam 18 will be used to contain the solder if a reflow step is performed prior to removing the first (exposed) portion of the under bump metallurgy layer 16 not covered by solder, as discussed below. A mask layer 20 is then formed on the solder dam 18. The mask layer may comprise a photoresist mask or other mask known to those having skill in the art.

Figure 3:
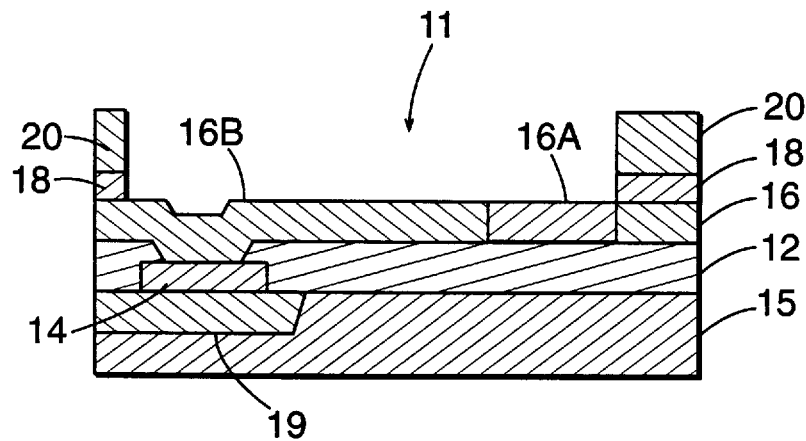
Figure 8:
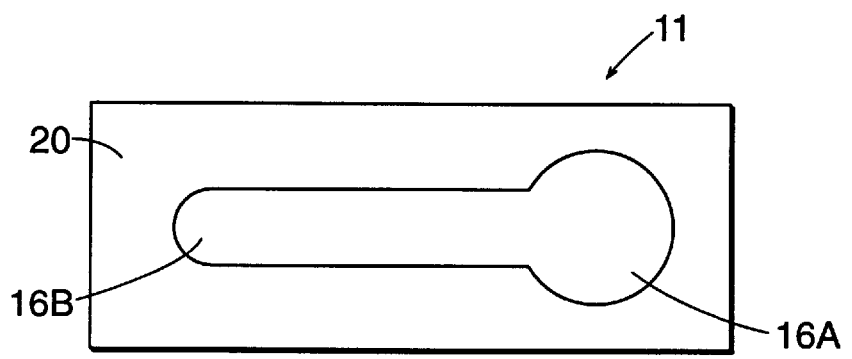

The mask layer 20 is patterned to cover the solder dam over the first portion of the under bump metallurgy layer and to uncover areas of the solder dam 18 over a second portion of the under bump metallurgy layer 16 on which the solder bump and redistribution routing conductor will be formed. The uncovered portion of the solder dam is then removed thereby uncovering the second portion of under bump metallurgy layer 16, as shown in FIGS. 3 and 8. More particularly, the second portion of the under bump metallurgy layer 16, which is not covered by the solder dam and patterned mask layer, includes an enlarged width portion 16A and an elongate portion 16B.

Figure 4:
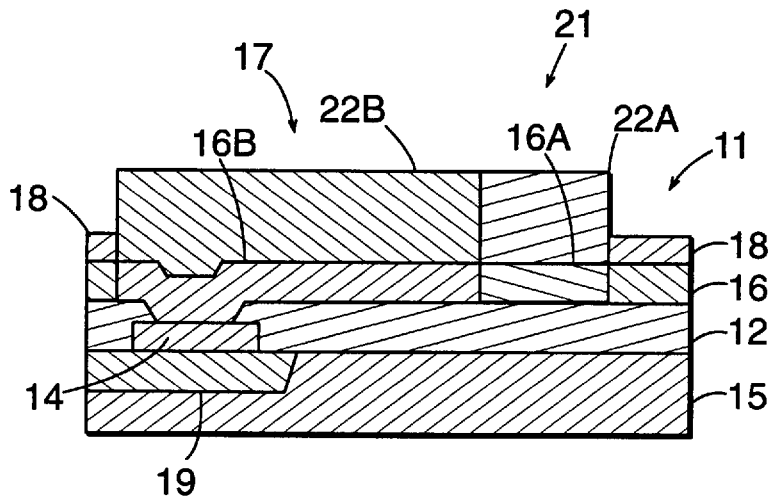
Figure 9:
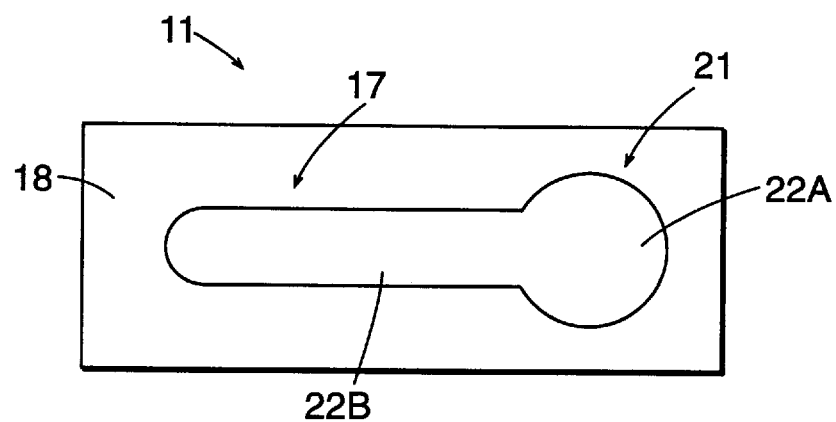

A solder layer 22 is preferably electroplated on the second portion of the under bump metallurgy layer 16, as shown in FIGS. 4 and 9. The solder can be electroplated by applying an electrical bias to the continuous under bump metallurgy layer 16 and immersing the microelectronic structure in a solution including lead and tin, as will be understood by those having skill in the art. This electroplating process allows solder layers to be formed simultaneously on a plurality of second portions of the under bump metallurgy layer 16. The solder will not plate on the mask layer 20. Alternatively, the solder can be applied by screen printing as a paste, by evaporation, by e-beam deposition, by electroless deposition or by other methods known to those having skill in the art. In addition, while lead-tin solder is used for purposes of illustration throughout the specification, other solders such as gold solder, lead-indium solder, or tin solder can be used as will be understood by those having skill in the art.

The solder layer 22 includes an elongate portion 22B and an enlarged width portion 22A. After removing the mask layer 20, the microelectronic structure 11 can be heated causing the solder to flow from the elongate solder portion 22B to the enlarged width solder portion 22A thereby forming a raised solder bump at the enlarged width solder portion 22A. The solder dam 18 prevents the solder from spreading beyond the elongate 16B and enlarged width 16A portions of the under bump metallurgy layer 16, as shown in FIGS. 5 and 10.

The solder will flow when heated above its liquidus temperature (approximately 299° C. for solder having 90% lead and 10% tin), and this process is commonly referred to as solder reflow. During reflow, the surface tension of the solder creates a relatively low internal pressure in the enlarged width solder portion 22A over the relatively wide geometry provided for the solder bump, and a relatively high internal pressure in the elongate solder portion 22B over the relatively narrow geometry provided for the redistribution routing conductor.

In order to equalize this internal pressure differential, solder flows from the elongate solder portion 22B to the enlarged width solder portion 22A. Accordingly, the solder forms a raised solder bump at the enlarged width solder portion 22A and a relatively thin layer of solder at the elongate solder portion 22B over the redistribution routing conductor. When the solder is cooled below its liquidus temperature, it solidifies maintaining its shape including the raised solder bump and the thin layer of solder over the redistribution routing conductor.

It is known in the art of printed circuit board manufacture to apply solder at a uniform level on PCB lands by screen printing, and that the level of solder can be increased locally by enlarging a part of the land. See, Swanson, "PCB Assembly: Assembly Technology in China," *Electronic Packaging & Production,* pp. 40, 42, January 1995. To their knowledge, however, Applicants are the first to realize that solder can be electroplated on a microelectronic substrate at a uniform level and then heated to produce a raised solder bump together with a redistribution routing conductor on the substrate.

Furthermore, U.S. Pat. No. 5,327,013 to Moore et al. states that a microsphere of a solder alloy can be pressed onto a pad, and that a stop formed of a polymeric solder resist material can be applied to the runner to confine the solder to the bond pad. While this patent states that the spread of solder along the runner during reflow can be limited by constricting the width of the runner section relative to the bond pad, there is no suggestion that the relative dimensions of the runner section and the bond pad can be used to cause solder to flow from the runner to the bond pad thereby forming a multilevel solder structure. In addition, neither of these references suggest that a solder structure having an elongate portion and an enlarged width portion can be used to mask the under bump metallurgy layer in order to form a redistribution routing conductor together with a raised solder bump using only a single masking step.

The method of the present invention relies on differences in the surface-tension induced internal pressure of the reflowed (liquid) solder to form a thin layer of solder at the elongate solder portion 22B and a raised solder bump at the enlarged width solder portion 22A. The internal pressure P of a liquid drop of solder can be determined according to the formula:

$$P=2T/r,$$

where T is the surface tension of the liquid solder, and r is the radius of the drop.

Where liquid solder is on a flat wettable surface such as the under bump metallurgy layer, the formula becomes:

$$P=2T/r'.$$

In this formula, r' is the apparent radius of the liquid solder, and the apparent radius is the radius of the of the arc (radius of curvature) defined by the exposed surface of the solder. The apparent radius is dependent on the width of the underlying solder wettable layer such as the second portion of the under bump metallurgy layer which is in contact with the solder. Accordingly, the internal pressure of a reflowed solder structure is inversely proportional to the width of the second portion of the under bump metallurgy in contact with the solder. Stated in other words, a solder portion having on a relatively wide under bump metallurgy portion will have a relatively low internal pressure while a solder portion on an elongate (relative narrow) under bump metallurgy portion will have a relatively high internal pressure. The internal pressures will equalize when the apparent radii of the elongate solder portion 22B and the enlarged width solder portion 22A are approximately equal.

Accordingly, when the solder layer 22 with a uniform level illustrated in FIGS. 4 and 9 is heated above its liquidus temperature, solder flows from the elongate solder portion 22B to the enlarged width solder portion 22A until each portion has approximately the same apparent radius thereby forming a raised solder bump. If the solder flow step is performed prior to removing the first portion of the under bump metallurgy layer 16 not covered by the solder structure, an intermetallic can be formed between the solder portions 22A–B and under bump metallurgy portions 16A–B adjacent the solder wherein the intermetallic is resistant to etchants commonly used to remove the under bump metallurgy. Accordingly, this intermetallic reduces undercutting of the solder during the following step of removing the first portion of the under bump metallurgy not covered by solder, as discussed in U.S. Pat. No. 5,162,257 to Yung entitled "Solder Bump Fabrication Method" and assigned to the assignee of the present invention.

Preferably, the under bump metallurgy layer 16 includes a copper layer adjacent the solder structure and the solder is a lead-tin solder. Accordingly, the step of causing the solder to flow will cause the solder to react with the copper to form an intermetallic region adjacent the solder structure, and this intermetallic will comprise $Cu_3Sn$. This intermetallic does not readily react with etchants commonly used to remove under bump metallurgy layers thereby reducing undercutting of the solder structure.

The solder layer 22 is then preferably used as a mask to selectively etch the first portions of the solder dam 18 and under bump metallurgy 16 not covered by solder. A chemical etchant can be used which etches the under bump metallurgy layer 16 preferentially with respect to the solder portions 22A–B. Accordingly, no additional masking step is required to pattern the under bump metallurgy layer. Stated in other words, the formation of mask layer 20 is the only masking step required to pattern the solder dam 18 (FIGS. 3 and 8), selectively expose the second portion of the under bump metallurgy layer 16 during the plating step (FIGS. 3 and 8), and remove the first portions of the under bump metallurgy layer not covered by solder after the plating step (FIGS. 5 and 10).

Alternately, the first portions of the under bump metallurgy layer 16 not covered by solder portions 22A and 22B can be selectively removed prior to causing the solder to flow. In this case, the elongate 22B and enlarged width 22A solder portions are respectively supported on only the elongate 16B and enlarged width 16A under bump metallurgy portions, and while the liquid solder is wettable to the under bump metallurgy, it is not wettable to the passivation layer 12. Accordingly, the passivation layer can contain the solder during the solder flow step, and the solder dam 18 can be eliminated.

In another alternative, the solder dam can include a solder non-wettable layer on the under bump metallurgy layer 16 and a solder wettable layer, such as copper, on the solder non-wettable layer opposite the under bump metallurgy layer, as disclosed in U.S. Patent Application to Mis et al. entitled "Solder Bump Fabrication Methods and Structures Including a Titanium Barrier Layer" filed Mar. 20, 1995, and assigned to the assignee of the present invention. The solder wettable layer allows solder to be plated on portions of the solder dam as well as the second portion of the under bump metallurgy layer not covered by the solder dam or mask.

Accordingly, the mask layer 20 can uncover portions of the solder dam as well as portions of the under bump metallurgy layer 16 thereby allowing a greater volume of solder to be plated. The mask layer 20 and underlying portions of the solder wettable layer are then removed. When heat is applied to cause the solder to flow, the remaining portion of the solder wettable layer under the solder will be dissolved into the solder exposing the solder to the solder non-wettable layer. Accordingly, the solder will retreat to the second portion of the under bump metallurgy layer which is wettable.

As an example, a first portion of the under bump metallurgy layer 16 is covered by a solder dam 18 and a mask layer 20. A second portion of the under bump metallurgy layer 16 is uncovered and has an elongate portion 16B that is 150 $\mu$m wide and 500 $\mu$m long, and a circular enlarged width portion 16A with a 500 $\mu$m diameter (or width), as shown in FIGS. 3 and 8. A uniform 35 $\mu$m high solder layer 22 is then electroplated on the second portion of the under bump metallurgy layer 16 including elongate portion 16A and enlarged width portion 16B, as shown in FIG. 4. This solder is 90% lead and 10% tin. After removing the mask layer 20, the solder is heated above its liquidus temperature (approximately 299° C.) allowing it to flow.

The liquid solder is contained on the second portion 16A–B of the solder wettable under bump metallurgy layer by the solder dam 18 to which the solder will not wet. Because the solder structure has varying widths, the internal pressure of the solder structure is not consistent when the height is uniform. In particular, the internal pressure of the elongate solder portion 22B is relatively high (approximately $1.283 \times 10^4$ Pa or 1.86 psi) and the internal pressure of the enlarged width solder portion 22A is relatively low (approximately $3.848 \times 10^3$ Pa or 0.558 psi) at the original solder height.

Accordingly, solder flows from the elongate solder portion 22B to the enlarged width solder portion 22A until the internal pressures equalize, thereby forming a raised solder bump at the enlarged width solder portion 22A, as shown in FIGS. 5 and 10. In FIGS. 5 and 10, the solder dam 18 and the first portion of the under bump metallurgy layer 16 not covered by the solder structure have also been removed.

In this example, equilibrium is obtained at an internal pressure of approximately $3.4 \times 10^3$ Pa (0.493 psi). At equilibrium, the elongate solder portion 22B is approximately 10 $\mu$m high and the enlarged width solder portion is approximately 130 $\mu$m high, and both portions have a radius of curvature of approximately 281 $\mu$m. Accordingly, a two level solder structure can be provided with a single masking step. When cooled, this structure solidifies while maintaining its form. In addition, the elongate solder portion 22B with a solder height of 10 $\mu$m is sufficient to mask the respective elongate under bump metallurgy layer portion 16B when removing the first portion of the under bump metallurgy layer not covered by solder. The enlarged width portion of the solder structure may have a width (or diameter if the enlarged width portion is circular) of at least 2 times a width of the elongate portion of the solder structure in order to ensure that the solder bump formed by the method described above is sufficiently raised relative to the elongate solder portion to provide an adequate connection to a printed circuit board.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A flip-chip structure comprising:

a semiconductor substrate including an electronic device formed thereon;

a contact pad on said semiconductor substrate electrically connected to said electronic device;

a passivation layer on said semiconductor substrate and on said contact pad wherein said passivation layer defines a contact hole therein exposing a portion of said contact pad;

an under bump metallurgy structure on said passivation layer electrically contacting said portion of said contact pad that is exposed, said metallurgy structure including an elongate portion in contact with said contact pad and an enlarged width portion on said passivation layer;

a solder structure on said under bump metallurgy structure opposite said semiconductor substrate, said solder structure including an elongate portion on said elongate portion of said metallurgy structure opposite said contact pad and an enlarged width portion on said enlarged width portion of said metallurgy structure opposite said passivation layer; and wherein said elongate portion of said solder structure has a first thickness and said enlarged width portion of said solder structure has a second thickness, and said first thickness is less than approximately one-half of said second thickness.

2. A flip-chip structure according to claim 1 wherein said elongate portion of said under bump metallurgy structure has a first end electrically contacting said exposed portion of said contact pad and a second end remote from said contact pad and connected to said enlarged width portion of said under bump metallurgy structure.

3. A flip-chip structure comprising:

a semiconductor substrate including an electronic device formed thereon;

a contact pad on said semiconductor substrate electrically connected to said electronic device;

a passivation layer on said semiconductor substrate and on said contact pad wherein said passivation layer defines a contact hole therein exposing a portion of said contact pad;

an under bump metallurgy structure on said passivation layer electrically contacting said portion of said contact pad that is exposed, said metallurgy structure including an elongate portion in contact with said contact pad and an enlarged width portion on said passivation layer;

a solder structure on said under bump metallurgy structure opposite said semiconductor substrate, said solder structure including an elongate portion on said elongate portion of said metallurgy structure opposite said contact pad and an enlarged width portion on said enlarged width portion of said metallurgy structure opposite said passivation layer; and wherein said elongate portion of said solder structure and said enlarged width portion of said solder structure have a single substantially uniform thickness.

4. A flip-chip structure according to claim 1 wherein said enlarged width portion of said solder structure has a width of at least 2 times a width of said elongate portion of said solder structure.

5. A flip-chip structure according to claim 1 wherein said under bump metallurgy structure comprises a chromium layer on said passivation layer, a phased layer of chromium and copper on said chromium layer opposite said passivation layer, and a copper layer on said phased layer opposite said chromium layer.

6. A flip-chip structure according to claim 5 wherein said under bump metallurgy structure comprises a titanium layer between said chromium layer and said passivation layer.

7. A flip-chip structure according to claim 1 further comprising an intermetallic region between said under bump metallurgy structure and said solder structure, said intermetallic region comprising a constituent of said metallurgy structure and a constituent of said solder structure.

8. A flip-chip structure according to claim 7 wherein said intermetallic region comprises copper and tin.

9. A flip-chip structure according to claim 1 wherein said solder structure comprises lead tin solder.

10. A flip-chip structure comprising:

a semiconductor substrate including an electronic device formed thereon;

a contact pad on said semiconductor substrate electrically connected to said electronic device;

a passivation layer on said semiconductor substrate and on said contact pad wherein said passivation layer defines a contact hole therein exposing a portion of said contact pad;

an under bump metallurgy layer on said passivation layer and electrically contacting said portion of said contact pad that is exposed;

a solder structure on said under bump metallurgy layer opposite said semiconductor substrate, said solder structure including an elongate portion opposite said contact pad and an enlarged width portion opposite said passivation layer; and wherein said elongate portion of said solder structure has a first thickness and said enlarged width portion of said solder structure has a second thickness, and said first thickness is less than approximately one-half of said second thickness.

11. A flip-chip structure according to claim 10 wherein said under bump metallurgy layer extends across said passivation layer, said solder structure defining first and second portions of said under bump metallurgy layer, said second portion of said under bump metallurgy layer including an elongate portion and an enlarged width portion respectively corresponding to said elongate and enlarged width portions of said solder structure, and said first portion extending beyond said elongate and enlarged width portions of said solder structure.

12. A flip-chip structure according to claim 11 further comprising a solder dam on said first portion of said under bump metallurgy layer.

13. A flip-chip structure according to claim 10 wherein said elongate portion of said solder structure has a first end adjacent said exposed portion of said contact pad and a second end remote from said contact pad and connected to said enlarged width portion of said solder structure.

14. A flip-chip structure comprising:

a semiconductor substrate including an electronic device formed thereon;

a contact pad on said semiconductor substrate electrically connected to said electronic device;

a passivation layer on said semiconductor substrate and on said contact pad wherein said passivation layer defines a contact hole therein exposing a portion of said contact pad;

an under bump metallurgy layer on said passivation layer and electrically contacting said portion of said contact pad that is exposed;

a solder structure on said under bump metallurgy layer opposite said semiconductor substrate, said solder structure including an elongate portion opposite said contact pad and an enlarged width portion opposite said passivation layer; and wherein said elongate portion of said solder structure and said enlarged width portion of said solder structure have a single substantially uniform thickness.

15. A flip-chip structure according to claim 10 wherein said enlarged width portion of said solder structure has a width of at least 2 times a width of said elongate portion of said solder structure.

16. A flip-chip structure according to claim 10 wherein said under bump metallurgy layer comprises a chromium layer on said passivation layer, a phased layer of chromium and copper on said chromium layer opposite said passivation layer, and a copper layer on said phased layer opposite said chromium layer.

17. A flip-chip structure according to claim 16 wherein said under bump metallurgy layer comprises a titanium layer between said chromium layer and said passivation layer.

18. A flip-chip structure according to claim 10 further comprising an intermetallic region between said under bump metallurgy layer and said solder structure, said intermetallic region comprising a constituent of said metallurgy layer and a constituent of said solder structure.

19. A flip-chip structure according to claim 18 wherein said intermetallic region comprises copper and tin.

20. A flip-chip structure according to claim 10 wherein said solder structure comprises lead tin solder.

* * * * *

UNITED STATES PATENT AND TRADEMARK OFFICE
CERTIFICATE OF CORRECTION

PATENT NO. : 5,892,179
DATED : April 6, 1999
INVENTOR(S) : Rinne et al.

It is certified that error appears in the above-identified patent and that said Letters Patent is hereby corrected as shown below:

Title page, Item [56]:

In the References Cited, OTHER PUBLICATIONS, insert --PCB Assembly Electronic Packaging & Production, Vol. 35, No. 1, p. 40 (Jan. 1995)--.

Signed and Sealed this

Twenty-ninth Day of August, 2000

*Attest:*

Q. TODD DICKINSON

*Attesting Officer*      *Director of Patents and Trademarks*